(12) United States Patent
Miyazaki et al.

(10) Patent No.: US 10,153,236 B2
(45) Date of Patent: Dec. 11, 2018

(54) SEMICONDUCTOR DEVICE AND POWER ELECTRONICS APPARATUS

(71) Applicant: HITACHI, LTD., Chiyoda-ku, Tokyo (JP)

(72) Inventors: Takaaki Miyazaki, Tokyo (JP); Osamu Ikeda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 86 days.

(21) Appl. No.: 15/311,671

(22) PCT Filed: Aug. 31, 2015

(86) PCT No.: PCT/JP2015/074697
§ 371 (c)(1),
(2) Date: Nov. 16, 2016

(87) PCT Pub. No.: WO2017/037837
PCT Pub. Date: Mar. 9, 2017

(65) Prior Publication Data
US 2018/0182716 A1    Jun. 28, 2018

(51) Int. Cl.
*H01L 23/049* (2006.01)
*H01L 23/00* (2006.01)
(Continued)

(52) U.S. Cl.
CPC ............ *H01L 23/562* (2013.01); *B60R 16/02* (2013.01); *B61C 17/00* (2013.01); *H01L 23/049* (2013.01); *H01L 23/053* (2013.01); *H01L 23/12* (2013.01); *H01L 23/36* (2013.01); *H01L 23/3735* (2013.01); *H01L 23/4924* (2013.01); *H01L 24/73* (2013.01); *H01L 2224/48091* (2013.01);
(Continued)

(58) Field of Classification Search
CPC . H01L 23/562; H01L 23/049; H01L 23/3735; H01L 23/4924; H01L 24/73
See application file for complete search history.

(56) References Cited

U.S. PATENT DOCUMENTS 5,654,586 A * 8/1997 Schwarzbauer .... H01L 23/3735
257/700
2012/0077023 A1* 3/2012 Nagahiro ............... C04B 35/119
428/328

(Continued)

FOREIGN PATENT DOCUMENTS

JP          8-509844 A    10/1996
JP      2001-68592 A     3/2001
(Continued)

*Primary Examiner* — Joseph Galvin, III
(74) *Attorney, Agent, or Firm* — Miles & Stockbridge P.C.

(57) ABSTRACT

A semiconductor device is provided, the semiconductor device having: a semiconductor chip; a wiring substrate which supports the semiconductor chip and is electrically connected to the semiconductor chip; a first metal plate which supports the wiring substrate; a second metal plate which is arranged between the wiring substrate and the first metal plate; a first bonding part which bonds the wiring substrate and the second metal plate; and a second bonding part which bonds the first metal plate and the second metal plate, and having a thickness of an outer circumferential part of the second metal plate being larger than a thickness of a center part of the second metal plate.

15 Claims, 11 Drawing Sheets

(51) Int. Cl.
    *H01L 23/12*     (2006.01)
    *H01L 23/36*     (2006.01)
    *B60R 16/02*     (2006.01)
    *B61C 17/00*     (2006.01)
    *H01L 23/373*     (2006.01)
    *H01L 23/492*     (2006.01)
    *H01L 23/053*     (2006.01)
    *H02M 7/00*     (2006.01)

(52) U.S. Cl.
    CPC ............... *H01L 2224/48227* (2013.01); *H01L 2224/73265* (2013.01); *H01L 2924/14252* (2013.01); *H01L 2924/3511* (2013.01); *H01L 2924/3512* (2013.01); *H02M 7/003* (2013.01)

(56) References Cited

U.S. PATENT DOCUMENTS

2012/0267149 A1* 10/2012 Oi ....................... H01L 21/4807
                                                                                         174/255
2013/0148314 A1     6/2013  Hirai et al.

FOREIGN PATENT DOCUMENTS

| JP | 2012-28674 A | 2/2012 |
|---|---|---|
| JP | 2012-109314 A | 6/2012 |
| WO | WO 2013/001999 A1 | 1/2013 |

* cited by examiner

SEMICONDUCTOR DEVICE AND POWER ELECTRONICS APPARATUS

TECHNICAL FIELD

The present invention relates to a semiconductor device, a railway vehicle, and an automobile, and, more particularly, relates to a structure of a power-system semiconductor device for use in an inverter.

BACKGROUND ART

As a structure of a power-system semiconductor device (power module), a structure in which a semiconductor element (hereinafter also referred to as a semiconductor chip or simply referred to as a chip) and an insulating substrate are bonded by soldering or others or a structure in which an insulating substrate and a metal plate for heat dissipation are bonded by soldering or others has been known.

In recent years, development of semiconductor devices using a wide-gap semiconductor made of SiC (silicon carbide), GaN (gallium nitride), or others which can be operated at a high temperature and in which a weight and a size of a device can be reduced has been advanced. Generally, while a semiconductor element of Si (silicon) has an upper limit operating temperature of 150 to 175° C., a semiconductor element of SiC can be used at 175° C. or higher.

Also, while solder which is a connecting member for use in electrical connection among components of an electrical and electronic apparatus generally contains lead (Pb), regulation for the lead has started in recent years because of the increase of awareness for environmental problem. For example, in Europe, the ELV directive (End of Life Vehicles directive, directive for discarded automobiles) for regulating the use of lead inside automobiles has been executed. Also in Europe, the RoHs (Restriction of the use of certain Hazardous Substances in electrical and electronic equipment) directive for prohibiting the use of lead inside electrical and electronic apparatuses has been executed.

Previously, lead-containing solder had been used as a connecting member for semiconductor devices requiring high heat resistance, particularly, for semiconductor devices for use in the field of automobiles, construction machines, railways, information apparatuses, or others. However, in order to reduce an environmental burden, it has been strongly required to use lead-free connecting members.

Patent Document 1 (Japanese Patent Application Laid-open Publication (Translation of PCT Application) No. H08-509844) describes that "an object of the present invention relates to a power semiconductor element in which a ceramic substrate (SUB) and a metal bottom plate (BP) are bonded to each other via a bonding layer (2), a buffer layer (DP) made of a material with a low yield point and a high thermal conductivity, and another bonding layer (3) in this order, and in which a mechanical bonding between the ceramic substrate and the bottom plate has a high shearing strength, and besides, physical fatigue and crack formation at an early stage due to different thermal expansions of the ceramic substrate and the bottom plate from each other are avoided by plastic deformation of the buffer layer", and describes that "the bonding layer is such a sintered silver powder layer as being advantageously used in a power semiconductor element in, for example, a low-temperature bonding technique (refer to Abstract)."

Also, Patent Document 2 (Japanese Patent Application Laid-open Publication No. 2012-28674) describes that "a semiconductor element 3, a first buffer plate 7A whose one surface is bonded to an electrode of the semiconductor element 3 via a bonding member 6a, a second buffer plate 7B whose one surface is bonded to the other surface of the first buffer plate 7A via a bonding member 6b, and a wiring member 4 bonded to the other surface of the second buffer plate 7B are provided, describes that the first buffer plate 7A has a liner expansion coefficient αBA between a liner expansion coefficient αC of the semiconductor element and a liner expansion coefficient αW of the wiring member 4, the liner expansion coefficient αBA having a difference smaller than a first predetermined value from the liner expansion coefficient αC of the semiconductor element 3, and describes that the second buffer plate 7B has a liner expansion coefficient αBB between the liner expansion coefficient αBA of the first buffer plate 7A and the liner expansion coefficient αW of the wiring member 4, the liner expansion coefficient αBB having a difference larger than the first predetermined value but smaller than a second predetermined value from the liner expansion coefficient αW of the wiring member 4 (refer to Abstract)."

RELATED ART DOCUMENTS

Patent Documents

Patent Document 1: Japanese Patent Application Laid-open Publication (Translation of PCT Application) No. H08-509844 Patent Document 2: Japanese Patent Application Laid-open Publication No. 2012-28674

SUMMARY OF THE INVENTION

Problems to be Solved by the Invention

In a power module, securement of reliability of a soldered bonding part between the insulating substrate and a heat-dissipating base plate (bonding part below the substrate) is a task. In the power module, heat is generated in a chip by energization. Therefore, temperature change is repeatedly caused in the soldered bonding part by repeat of turning ON/OFF, and strain is repeatedly caused in the soldered bonding part by a difference in the linear expansion coefficient between the members. Thus, breakage occurs from an end of the soldered bonding part. When breakage occurs in the bonding part, a bonding area is decreased, and a heat dissipation performance is degraded. Therefore, the temperature of the bonding part is increased to cause accelerative destruction to proceed and, eventually, the power module is broken.

Generally, the bonding part below the substrate has a smaller difference in the liner expansion coefficient between members than that of the bonding part between the chip and the substrate. However, the breakage of the bonding part as described above tends to proceed even in the bonding part below the substrate. The reason for this is that the amount of strain occurring at an end of the bonding part below the substrate is not small since the bonding area of the bonding part below the substrate is larger than that of the bonding part between the chip and the substrate.

In Patent Document 1, it is attempted to achieve high reliability by inserting a metal flat plate with a low yield point into the bonding part below the substrate to cause plastic deformation of the metal layer. However, the bonding part is greatly deformed by the plastic deformation of the metal layer, and therefore, a possibility of more acceleration of the breakage is not taken into consideration. Moreover, in Patent Document 2, in order to improve reliability of an Al (aluminum) wiring bonding part on a chip, a metal plate whose linear expansion coefficient is adjusted is inserted between the chip and the Al wiring. However, application of this technique to the bonding part below the substrate having a significantly larger bonding area than that of the chip bonding part is not taken into consideration.

Furthermore, decrease of reliability of the semiconductor device caused when a thin metal flat plate is inserted into the bonding part below the substrate is not taken into consideration, either, the decrease of reliability being caused since the metal flat plate is greatly warped at a stage of bonding one surface, which results in difficulty in subsequent processes, and since strain occurring in the solder due to the warpage of the metal flat plate increases.

The above and other object and novel characteristics of the present invention will be apparent from the description of the present specification and the accompanying drawings.

Means for Solving the Problems

The typical summary of the inventions disclosed in the present application will be briefly described as follows.

A semiconductor device according to a typical embodiment includes a wiring substrate which supports a semiconductor chip, a metal plate which supports the wiring substrate, a metal plate for reducing strain arranged between the wiring substrate and the metal plate, a first bonding part which bonds the wiring substrate and the metal plate for reducing strain, and a second bonding part which bonds the metal plate and the metal plate for reducing strain, and has a thickness of an outer circumferential part of the second metal plate which is larger than a thickness of a center part thereof.

EFFECTS OF THE INVENTION

According to the typical embodiment, reliability in a semiconductor device can be improved.

BRIEF DESCRIPTIONS OF THE DRAWINGS

BEST MODE FOR CARRYING OUT THE INVENTION

Hereinafter, embodiments of the present invention will be described in detail based on the accompanying drawings. Note that components having the same function are denoted by the same reference symbols throughout all the drawings for describing the embodiments, and the repetitive description thereof will be omitted.

(First Embodiment)

Figure 1:
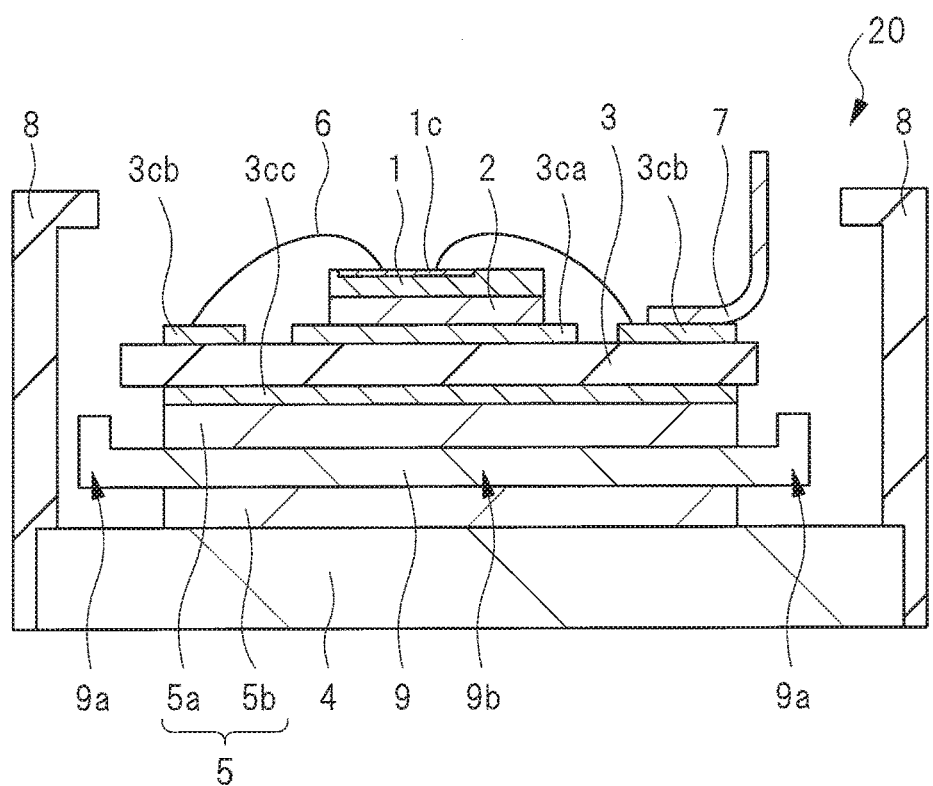
FIG. 1 is a cross-sectional view illustrating a semiconductor device according to a first embodiment of the present invention.

FIG. 1 is a cross-sectional view illustrating an example of a structure of a semiconductor device (power module) of an embodiment of the present invention.

The semiconductor device of the present embodiment is, for example, a semiconductor module (power module) mounted on a railway vehicle, a vehicle body of an automobile, or others. That is, the power module is a semiconductor device including a plurality of power-system semiconductor chips (semiconductor elements) 1 and requiring heat-dissipation measures. On the semiconductor chip 1, for example, an IGBT (Insulated Gate Bipolar Transistor), MOSFET (Metal Oxide Semiconductor Field Effect Transistor), or others is mounted. However, the invention is not limited to this. The power-system semiconductor chip (semiconductor element) described in the present application is, for example, an element to be used for power, and is a semiconductor element capable of handling a relatively large voltage and large current. Also, a device including such an element is referred to as a power module.

A structure of a power module 20 illustrated in FIG. 1 is described. The power module 20 has the semiconductor chip 1 and a ceramic substrate (wiring substrate) 3 which supports the semiconductor chip 1. Also, the power module 20 has a conductive wire 6 which electrically connects an electrode 1c on an upper surface (main surface) of the semiconductor chip 1 and an electrode 3cb on an upper surface of the ceramic substrate 3, and also has a terminal (lead) 7 electrically connected to the electrode 3cb of the ceramic substrate 3 and drawn to the outside. Note that only one semiconductor chip 1 is illustrated in the drawing. However, a plurality of semiconductor chips 1 are arranged on the ceramic substrate 3.

The ceramic substrate 3 on which the plurality of semiconductor chips 1 and a plurality of terminals 7 are mounted is mounted on a base plate (metal plate) 4 via solder (bonding member, bonding part, solder alloy) 5. That is, the base plate 4 supports the ceramic substrate 3 on the base plate 4 via the solder 5. Here, a plurality of electrodes 3ca and a plurality of electrodes 3cb are formed in contact with the upper surface of the ceramic substrate 3, and an electrode 3cc is formed in contact with a lower surface of the ceramic substrate 3. The semiconductor chip 1 is bonded to an upper surface of the electrode 3ca via solder 2. As a material of the ceramic substrate 3, a material having a high thermal conductivity such as Al (aluminum), Cu (copper), AlN (aluminum nitride), or $Si_3N_4$ (silicon nitride), is used.

These electrodes 3ca, 3cb, and 3cc are made, for example, by nickel (Ni) metallization. That is, each of the electrodes 3ca, 3cb, and 3cc has a structure in which an electrode made of, for example, Cu or Al, is subjected to a plating process to be covered with a nickel film. And, the electrode 3cc formed on a lower surface side of the ceramic substrate 3 is electrically connected to the base plate 4 via solder 5.

When seen in a plan view, the area of the ceramic substrate 3 is larger than that of the semiconductor chip 1, and the area of the base plate 4 is larger than that of the ceramic substrate 3. Thus, the area of the solder 5 which bonds the ceramic substrate 3 and the base plate 4 is larger when seen in the plan view than that of the solder 2 which bonds the semiconductor chip 1 and the ceramic substrate 3.

That is, in the power module 20 of the present embodiment, the semiconductor chip 1 is connected to the ceramic substrate (wiring substrate, insulating substrate, connected member) 3 via the solder 2, and besides, the ceramic substrate 3 and the base plate (metal plate) 4 for heat dissipation which plays a role of releasing heat at the time of operation of the semiconductor chip 1 are connected to each other via the solder 5. That is, by the solder 5 arranged between the ceramic substrate 3 and the base plate 4, the ceramic substrate 3 and the base plate 4 are bonded to each other. The base plate 4 plays a role of a heat-dissipating plate, and therefore, is configured of a metal plate with high thermal conductivity.

When a specific structure of the power module 20 is described, the power module 20 has the semiconductor chip 1, the ceramic substrate 3 which is a chip support member connected to the semiconductor chip 1 via the solder (bonding member) 2, and a plurality of wires 6 electrically connected to the semiconductor chip 1. The electrode (conductor part, wire part) 3ca which is a part of a wiring pattern or others is formed on an upper surface of a base material of the ceramic substrate 3, and the semiconductor chip 1 is mounted on this electrode 3ca via the solder 2.

Also, the base plate 4 which is also a heat-dissipating plate, the plurality of semiconductor chips 1, the plurality of wires 6, and the ceramic substrate 3 are surrounded by a case 8 in which a resin for sealing not illustrated is filled. That is, the wall-shaped case 8 having a rectangular annular structure when seen in a plan view is provided in contact with a side wall of the base plate 4, and the semiconductor chip 1, the plurality of wires 6, the ceramic substrate 3, and others are separated from the case 8. The plurality of semiconductor chips 1, the plurality of wires 6, and the ceramic substrate 3 are sealed with the above-described resin for sealing. As the above-described resin, for example, a gel-type resin material is preferably used.

Furthermore, the semiconductor chip 1 is bonded via the solder 2 onto the electrode 3ca on the upper surface of the ceramic substrate 3. That is, a lower surface of the semiconductor chip 1 and the upper surface of the ceramic substrate 3 face each other, and a back-surface electrode of the semiconductor chip 1 and the electrode 3ca of the ceramic substrate 3 are electrically connected to each other via the solder 2.

Still further, on the upper surface of the semiconductor chip 1, for example, the gate electrode 1c is formed so as to be electrically connected to the electrode 3cb of the ceramic substrate 3 via the wire 6. One end of the terminal 7 is bonded to the electrode 3cb on the upper surface side of the ceramic substrate 3, and the other end thereof is drawn to the outside of the case 8. Each of the plurality of wires 6 is made of, for example, an Al wire, a copper wire, or others.

And, in the power module 20 of the present embodiment, the electrode 3cc which is a wiring part is formed on the lower surface of the ceramic substrate 3. To a lower surface of this electrode 3cc, a metal plate 9 which is a strain-reducing plate is bonded via solder 5a which is a bonding member (bonding part). To a lower surface of the metal plate 9, the base plate for heat dissipation (metal plate, heat-dissipating member) 4 is bonded via solder 5b which is a bonding member (bonding part).

That is, into the solder 5 between the ceramic substrate 3 and the base plate 4, the metal plate 9 is inserted. The solder 5 includes the solder 5a above the metal plate 9 and the solder 5b below the metal plate 9. In other words, an upper surface of the base plate 4 is bonded to the lower surface of the ceramic substrate 3 via the solder 5b, the metal plate 9, and the solder 5a sequentially formed above the base plate 4. When seen in a plan view, each of the solders 5a and 5b has an area larger than that of the solder 2.

The size of the metal plate 9 when seen in a plan view as being viewed from above is equal to the size of the ceramic substrate 3 when seen in a plan view or larger than the size of the ceramic substrate 3 when seen in a plan view. In other words, the size of the metal plate 9 made of a strain-reducing material when seen in a plan view is only required to be equal to or larger than the size of the ceramic substrate 3 when seen in a plan view.

Here, as illustrated in FIG. 1, the width of each of the solders 5a and 5b in a direction along the upper surface of the base plate 4 is smaller than the width of the ceramic substrate 3 and the width of the metal plate 9 in that direction. However, the width of the solder 5b in that direction may be larger than the width of the ceramic substrate 3 in that direction, and may be larger than the width of the metal plate 9 in that direction. Also, the width of the solder 5a in that direction may be larger than the width of the ceramic substrate 3 in that direction.

Here, a thickness of an outer circumferential part 9a of the metal plate 9 is larger than a thickness of an inner part (center part) 9b, which is an inside portion of the outer circumferential part 9a of the metal plate 9. Each of the outer circumferential part 9a and the inner part 9b described here is a part of the metal plate 9. The outer circumferential part 9a means an end in a direction along the upper surface or lower surface of the metal plate 9, that is, an end of the metal plate 9 when seen in a plan view. Therefore, the outer circumferential part 9a has an annular structure along the outer edge of the metal plate 9 when seen in a plan view, and the inner part 9b is surrounded by the outer circumferential part 9a when seen in a plan view. The thickness described in the present application indicates a length of each object in a direction perpendicular to the upper surface of the base plate 4.

The metal plate 9 is not a simple flat plate with a uniform thickness, but has a shape in which the thickness of its outer circumferential part 9a is larger than the thickness of the other portion (inner part 9b). Here, while the outer circumferential part 9a and the inner part 9b are the same as each other in the position of the height of the bottom surface of the metal plate 9, the upper surface of the metal plate 9 of the outer circumferential part 9a is positioned to be upper than the upper surface of the metal plate 9 of the inner part 9b. That is, the outer circumferential part 9a of the metal plate 9 protrudes upward with respect to the inner part 9b of the metal plate 9. Note that the term "upward (above)" described in the present application means a direction perpendicular to the upper surface of the base plate 4 and a direction from a base plate 4 side toward a ceramic substrate 3 side, and the term "downward (below)" means a direction toward an opposite side of the upward direction.

If the ceramic substrate 3 and the outer circumferential part 9a protruding upward are in contact with each other when the thickness of the solder 5a is small, there is a risk in which the electrode 3cc and the metal plate 9 cannot be appropriately bonded to each other by the solder 5a. Thus, the width of the metal plate 9 when seen in a plan view is desirably larger than the width of the ceramic substrate 3 when seen in a plan view. In other words, if the outer circumferential part 9a of the metal plate 9 is at a position not overlapping the ceramic substrate 3 when seen in a plan view, that is, a position outside the ceramic substrate 3, the contact between the convex-shaped outer circumferential part 9a and the ceramic substrate 3 can be prevented.

That is, even if the length of the outer circumferential part 9a protruding to a ceramic substrate 3 side with respect to the upper surface of the inner part 9b of the metal plate 9 is larger than the thickness of the solder 5a, the outer circumferential part 9a and the ceramic substrate 3 can be prevented from making contact with each other. In other words, in a direction perpendicular to the upper surface of the base plate 4, even if a distance from the upper surface of the inner part 9b of the metal plate 9 to the upper surface of the outer circumferential part 9a of the metal plate 9 is larger than a distance from the upper surface of the inner part 9b of the metal plate 9 to the lower surface of the ceramic substrate 3, the contact between the outer circumferential part 9a and the ceramic substrate 3 can be prevented.

Also, the linear expansion coefficient of the metal plate 9 has a value between the linear expansion coefficient of the base plate 4 and the linear expansion coefficient of the ceramic substrate 3 which is an insulating substrate with a circuit. As a material of the metal plate 9, for example, an alloy of Cu (copper) and Mo (molybdenum), a laminated layer film of Cu and Mo, or others can be used. Also, as a material of the metal plate 9, CIC (copper/inver/copper) can also be used. The linear expansion coefficient of the metal plate 9 can be adjusted by, for example, changing a mixing ratio of the above-described Cu and Mo.

The solders 5a and 5b are preferably made of a Sn (tin)-based solder alloy to be a Sn-based solder alloy such as Sn—Cu, Sn—Cu—Sn, Sn—Sb, or Sn—Ag—Cu. Furthermore, the solders 5a and 5b may be made by sintered bonding using metal particles such as Au, Ag, Cu, or Ni or made of a bonding material such as Zn—Al, Au—Ge, or Au—Si. Also, the solders 5a and 5b may be made of different bonding materials from each other.

Figure 21:
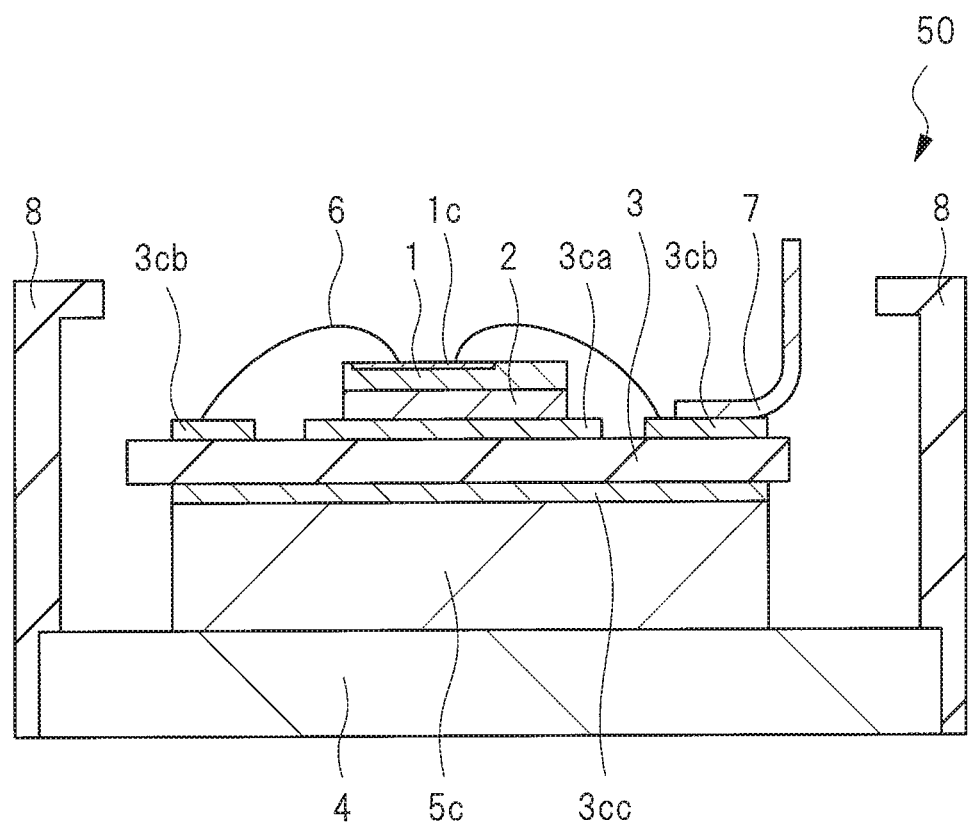
FIG. 21 is a cross-sectional view illustrating a semiconductor device of a comparative example.

Here, a module structure of a comparative example is described by using FIG. 21 to describe a difference between the power module 20 (refer to FIG. 1) of the present embodiment and the above-described comparative example. FIG. 21 is a cross-sectional view illustrating the structure of a semiconductor device of the comparative example compared and studied by the present inventors.

The structure of a module (power module 50) according to a semiconductor device of the comparative example illustrated in FIG. 21 is similar to the structure of the power module 20 illustrated in FIG. 1 except that the electrode 3cc on the lower surface side of the ceramic substrate 3 and the base plate 4 are bonded to each other by solder 5c and that the metal plate 9 (refer to FIG. 1) is not provided.

In a power-system device handling high voltages, when an ON state and an OFF state of the semiconductor element included in this device are repeatedly switched to each other, temperature changes repeatedly occur in the soldered bonding part. At this time, strain repeatedly occurs in the soldered bonding part due to the difference in the linear expansion coefficient between the members, and therefore, there is a problem of occurrence of the breakage of the bonding part. The occurrence of the breakage of the bonding part decreases the bonding area, and degrades the heat dissipation performance. Therefore, the temperature of the bonding part is increased to accelerate the breakage, and the power module is eventually broken. Particularly, if energization and shutdown of current are repeated in the semiconductor element of the semiconductor device (power module) when the use environment temperature is high, thermal stress occurring in the bonding part is increased. Therefore, in the power module, resistance against thermal fatigue by energization and resistance against crack progression by environmental temperature change are required.

In the power module 50 as illustrated in FIG. 21, the breakage can occur in a bonding part close to the semiconductor chip 1 which is a heat generating part, that is, in not only the solder 2 which bonds the semiconductor chip 1 and the ceramic substrate 3 but also a bonding part below the ceramic substrate 3. That is, even in the solder 5c which is a bonding part between the ceramic substrate 3 and the base plate 4 for heat dissipation, a temperature increase is caused by heat generation in the semiconductor chip 1 due to operation of the semiconductor chip 1.

Also, it can be thought that the solder 5c has an area as large as several times an area of the solder 2 or larger when seen in a plan view. In this case, due to the temperature increase and the large area of the solder 5c, the strain amount at the end of the solder 5c which is a bonding part is significantly increased, and the breakage proceeds from this end of the solder 5c.

In the power module 50, at the time of its operation, the semiconductor chip 1 generates heat. At this time, in the solder 5c which is a bonding part between the ceramic substrate 3 and the base plate 4, the temperature increases as almost high as that of the semiconductor chip 1 particularly at a portion immediately below the semiconductor chip 1. This is because a material with high thermal conductivity such as Al, Cu, AlN, or $Si_3N_4$ is used for the ceramic substrate 3. When the breakage proceeds in the solder 5c which is a heat-dissipation path, the heat dissipation performance is decreased, the temperature of the chip is increased, and the breakage further proceeds. Thus, eventually, the power module 50 is broken.

As a bonding method capable of suppressing the breakage of the solder below the ceramic substrate from its end, sintered metal bonding which causes a high mechanical strength after the bonding, bonding which uses Au (gold)-based solder, or others is assumed as a candidate. Here, in the sintered metal bonding, it is required to use fine metal particles each having a size of several nm to several hundreds of μm which are in a paste formed by a solvent such as alcohol, remove the solvent by heating at the time of bonding, and also perform pressurization.

However, as in the case of the bonding between the ceramic substrate 3 and the base plate 4, when large-area bonding is performed, it is difficult to remove the solvent even from a center part of the bonding part since the area of the bonding part is large, and therefore, this technique is difficult to be applicable. Moreover, since a large pressurizing force is required and a large-scale facility is required, it is difficult to apply this technique to a large-area bonding part. Also, when Au-based solder is used, there is a concern of a high cost in the application of this solder to a large-area solder part since Au is at high cost.

On the other hand, in the power module 20 of the present embodiment illustrated in FIG. 1, the strain occurring at the solder end can be reduced regardless of the material of the solders 5a and 5b by inserting the metal plate 9 into the large-area solder part between the ceramic substrate (insulating substrate) 3 and the base plate (metal plate for heat dissipation) 4, so that high reliability can be achieved. This is because the strain occurring between the ceramic substrate 3 and the base plate 4 can be reduced by inserting the metal plate 9 between the ceramic substrate 3 and the base plate 4, the metal plate 9 being made of a material with a linear expansion coefficient having a value between the linear expansion coefficient of the ceramic substrate 3 and the linear expansion coefficient of the base plate 4.

Figure 15:
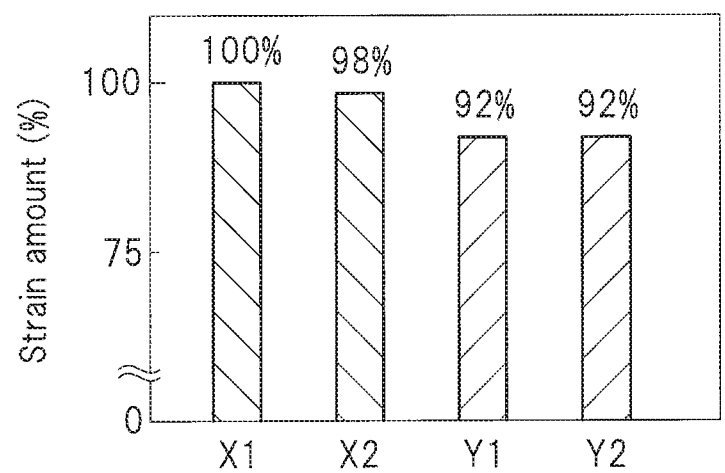
FIG. 15 is a graph illustrating results of an analysis of amounts of strain occurring at an end of a bonding part.
Figure 16:
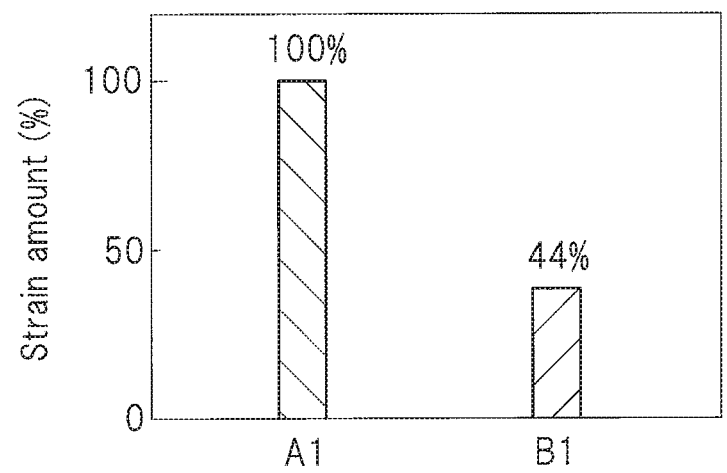
FIG. 16 is a graph illustrating results of an analysis of amounts of strain occurring at an end of a bonding part.
Figure 17:
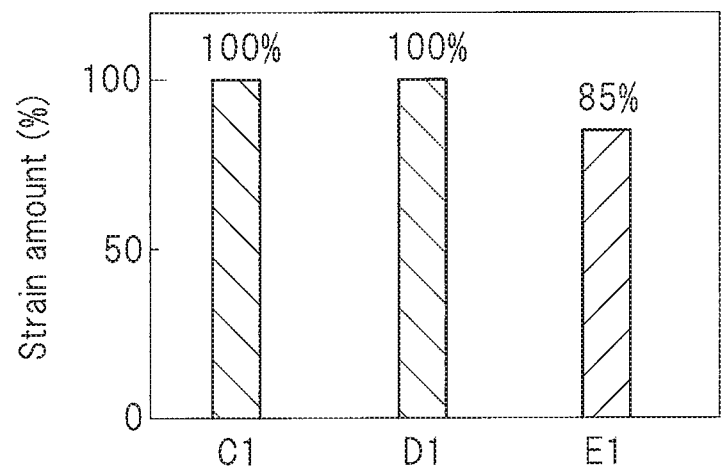
FIG. 17 is a graph illustrating results of an analysis of amounts of strain occurring at an end of a bonding part.

Next, by using FIGS. 2 to 17, an effect in which the outer circumferential part 9a of the metal plate 9 (refer to FIG. 1) in the present embodiment has a thickness larger than that of the inner part (inner circumferential part, center part) 9b is described based on the results analytically obtained by using predetermined models. In this analysis, note that simulation software on a computer was used to analyze the strain through a publicly-known thermal stress analyzing method. Also, since a module described below is an analysis model, the module is different from a power module for practical use as a product in a layout of an electrode on the ceramic substrate and others. FIGS. 15 to 17 are graphs each illustrating a result of the analysis of the strain amount occurring at the end of the bonding part.

Figure 2:
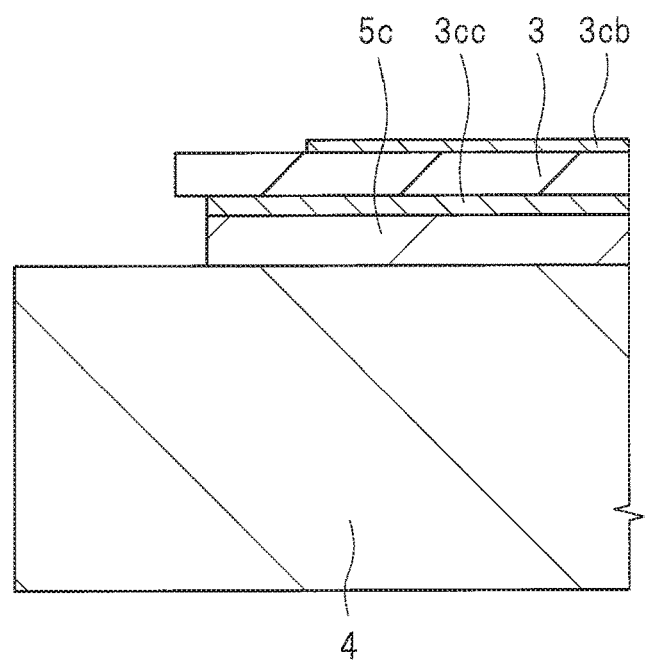
FIG. 2 is a cross-sectional view illustrating an analysis model of a comparative example.

FIG. 2 illustrates a cross-sectional view of an end of an analysis model of a comparative example. As similar to the comparative example described by using FIG. 21, a module of the analysis model of the comparative example illustrated in FIG. 2 has a structure in which the electrode 3cc and the base plate 4 are bonded to each other by the solder 5c without providing a metal plate for reducing the strain between the base plate 4 and the electrode 3cc on the lower surface side of the ceramic substrate 3. In FIG. 2, the thickness of the base plate 4 is 5 mm, the thickness of the solder 5c is 0.2 mm, the thickness of the electrode 3cc is 0.3 mm, the thickness of the ceramic substrate 3 is 0.6 mm, and the thickness of the electrode 3cb on the ceramic substrate 3 is 0.2 mm.

Figure 3:
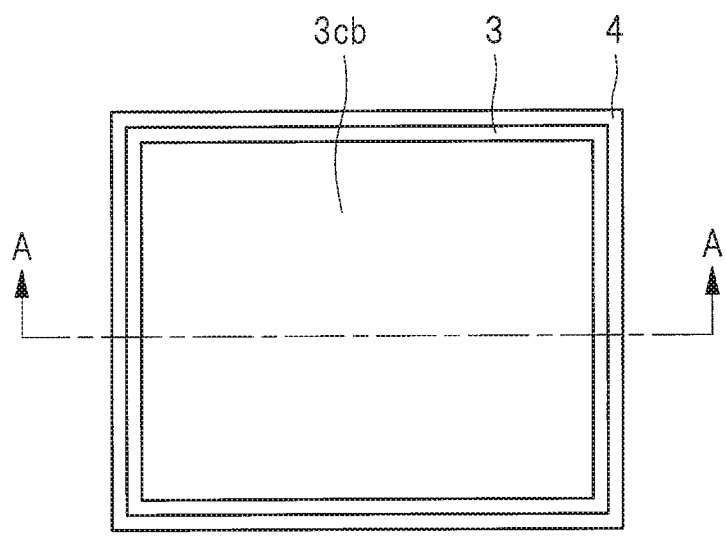
FIG. 3 is a plan view illustrating the analysis model of the comparative example.
Figure 4:
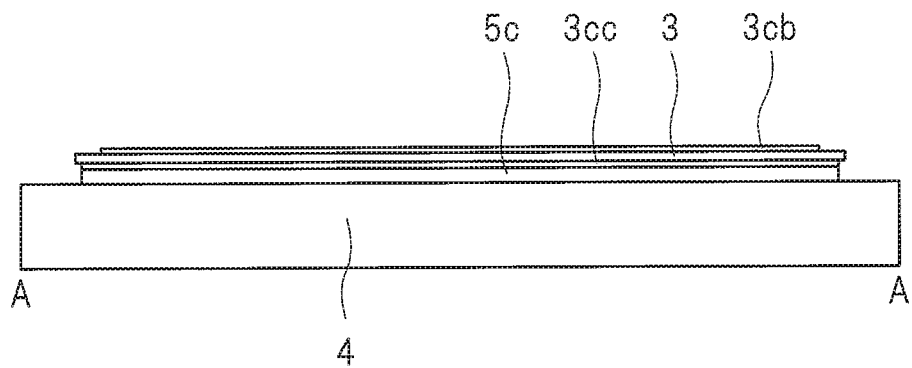
FIG. 4 is a cross-sectional view in an A-A line of FIG. 3.
Figure 5:
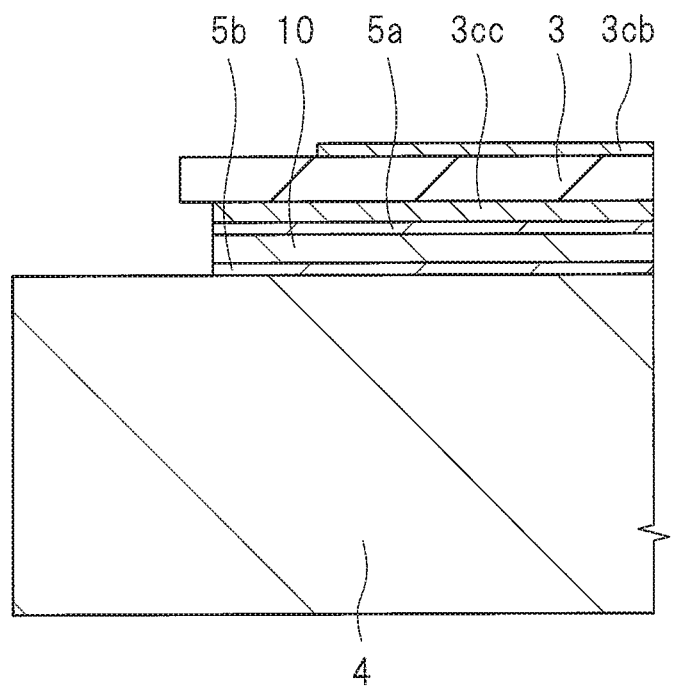
FIG. 5 is a cross-sectional view illustrating the analysis model of the comparative example.
Figure 6:
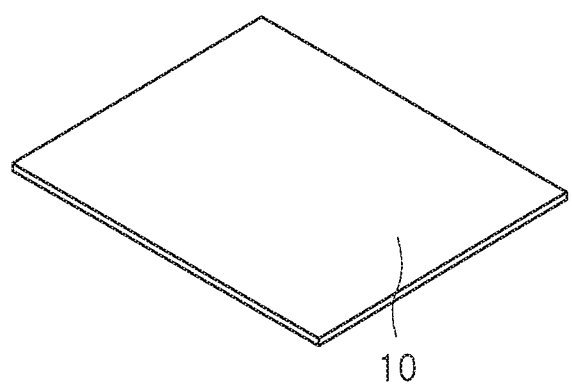
FIG. 6 is a perspective view illustrating the analysis model of the comparative example.

Also, an analysis model of another comparative example is illustrated in FIGS. 3 to 6. FIG. 3 is a plan view of the analysis model of the comparative example. FIG. 4 is a cross-sectional view of the analysis model of the comparative example. FIG. 4 is a cross-sectional view in an A-A line of FIG. 3. FIG. 5 is a cross-sectional view illustrating an end of the analysis model of the comparative example so as to be enlarged. FIG. 6 is a perspective view of a metal plate 10 used for reducing the strain in the analysis model of the comparative example. In the cross-sectional view of FIG. 4, note that illustration with hatching is omitted.

When seen in a plan view, the longitudinal and lateral dimensions of the electrode 3cb illustrated in FIG. 3 are 44 mm×54 mm. The longitudinal and lateral dimensions of the ceramic substrate 3 are 48 mm×58 mm. The longitudinal and lateral dimensions of the base plate 4 are 52 mm×62 mm. That is, the area of the ceramic substrate 3 when seen in a plan view is larger than the area of the electrode 3cb when seen in a plan view, and the area of the base plate 4 when seen in a plan view is larger than the area of the ceramic substrate 3 when seen in a plan view. Such a size relation among the electrode 3cb, the ceramic substrate 3, and the base plate 4 is similar to those of the analysis models illustrated in FIGS. 2 and 7 to 14.

Also, the thicknesses of the electrodes 3cb and 3cc, the ceramic substrate 3, and the base plate 4 illustrated in FIG. 5 are similar to those described by using FIG. 2. In the analysis model illustrated in FIG. 5 in contrast to the analysis model described by using FIG. 2, the meal plate 10 for reducing the strain is provided between the ceramic substrate 3 and the base plate 4. That is, the solder 5b, the metal plate 10, the solder 5a, the electrode 3cc, and the ceramic substrate 3 are sequentially provided on the base plate 4. When seen in a plan view, the width of the metal plate 10 is smaller than the width of the ceramic substrate 3. Each thickness of the solder 5a and 5c illustrated in FIG. 5 is 0.1 mm, and the thickness of the metal plate 10 is 1 mm.

As illustrated in FIGS. 5 and 6, the thickness of the metal plate 10 is uniform from an outer circumferential part to a center part of the metal plate 10. That is, the metal plate 10 is a flat plate having upper and lower flat surfaces. The longitudinal and lateral dimensions of the metal plate 10 illustrated in FIG. 6 are 47 mm×57 mm.

Figure 7:
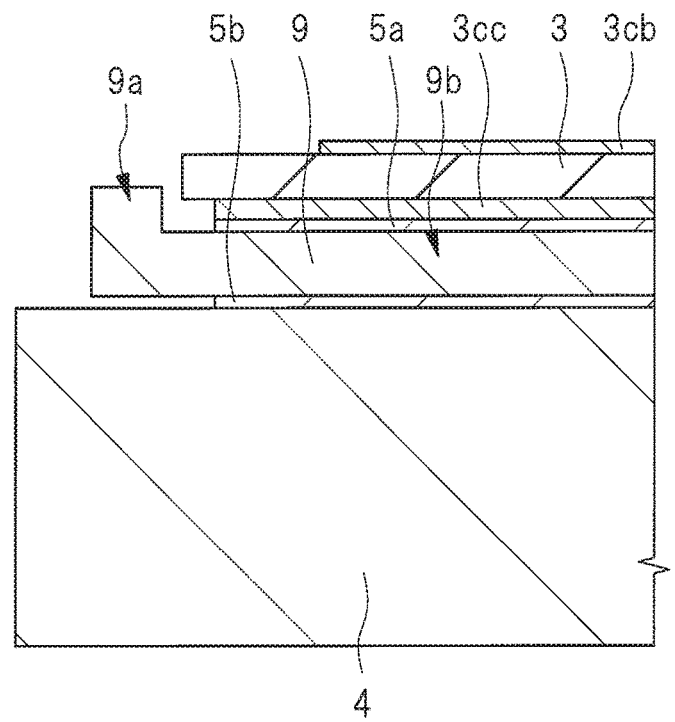
FIG. 7 is a cross-sectional view of an analysis model supporting for the semiconductor device of the first embodiment of the present invention.
Figure 8:
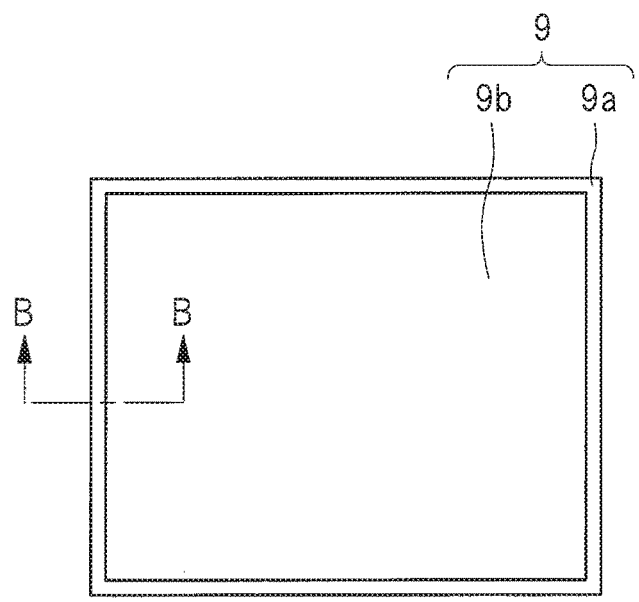
FIG. 8 is a plan view of the analysis model supporting for the semiconductor device of the first embodiment of the present invention.
Figure 9:
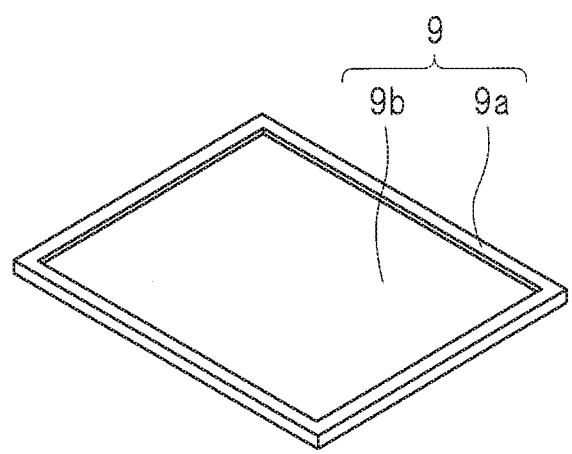
FIG. 9 is a perspective view of the analysis model supporting for the semiconductor device of the first embodiment of the present invention.
Figure 10:
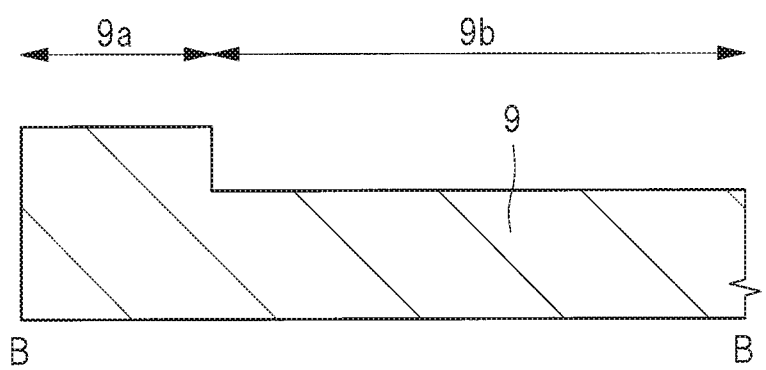
FIG. 10 is a cross-sectional view in a B-B line of FIG. 8.

FIGS. 7 to 10 illustrate an analysis model for handling the semiconductor device of the present embodiment. As similar to the structure illustrated in FIG. 1, the analysis model includes the metal plate 9 with the outer circumferential part 9a thicker than the inner part 9b. FIG. 7 is a cross-sectional view illustrating an end of the analysis model so as to be enlarged. FIG. 8 is a plan view illustrating the analysis model. FIG. 9 is a perspective view illustrating the analysis model. FIG. 10 is a cross-sectional view illustrating an end of the metal plate 9 included in the analysis model. FIG. 10 is a cross-sectional view in a B-B line of FIG. 8.

The thicknesses of the electrodes 3cb and 3cc, the ceramic substrate 3, and the base plate 4 illustrated in FIG. 7 are similar to those described by using FIG. 2. Also, the thickness of each of the solders 5a and 5b is 0.1 mm. The longitudinal and lateral dimensions of the metal plate 9 illustrated in FIGS. 8 to 10 are 51 mm×61 mm. The width of the outer circumferential part 9a of the metal plate 9 is 1.25 mm. Thus, the longitudinal and lateral dimensions of the inner part (center part) 9b of the metal plate 9 when seen in a plan view are 48.5 mm×58.5 mm. The thickness of the inner part 9b of the metal plate 9 illustrated in FIG. 10 is 1 mm, and the thickness of the outer circumferential part 9a is 1.5 mm. The width of the outer circumferential part 9a described here indicates a length of the outer circumferential part 9a in a direction orthogonal to an extending direction of the outer circumferential part 9a along each of four sides of the metal plate 9.

Figure 11:
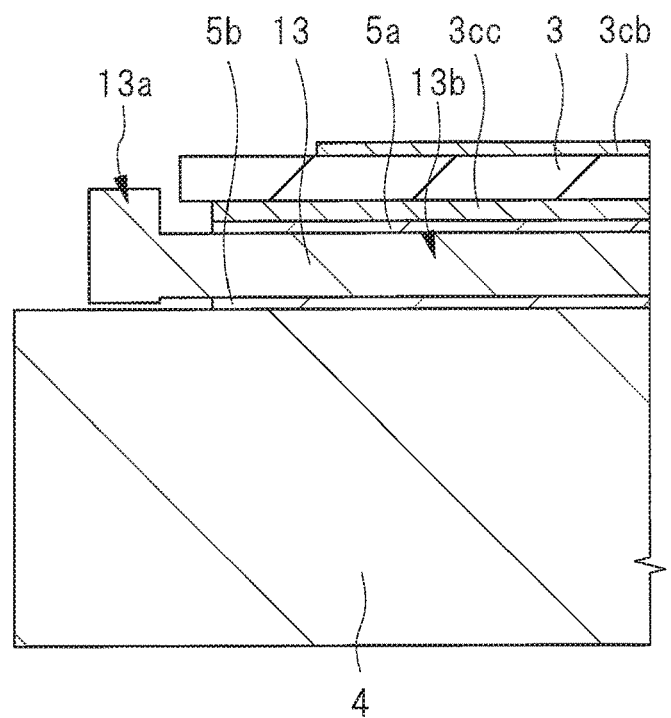
FIG. 11 is a cross-sectional view of an analysis model supporting for a semiconductor device of a modification example of the first embodiment of the present invention.
Figure 12:
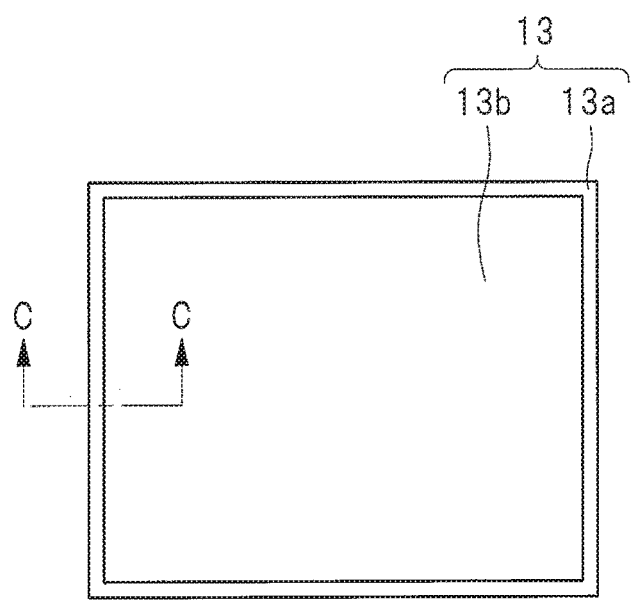
FIG. 12 is a plan view of the analysis model supporting for the semiconductor device of the modification example of the first embodiment of the present invention.
Figure 13:
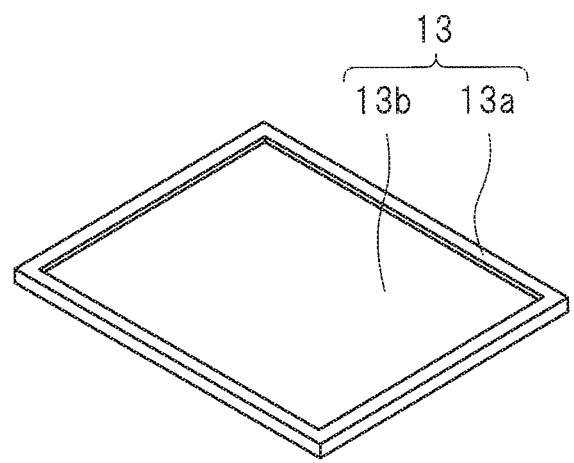
FIG. 13 is a perspective view of the analysis model supporting for the semiconductor device of the modification example of the first embodiment of the present invention.
Figure 14:
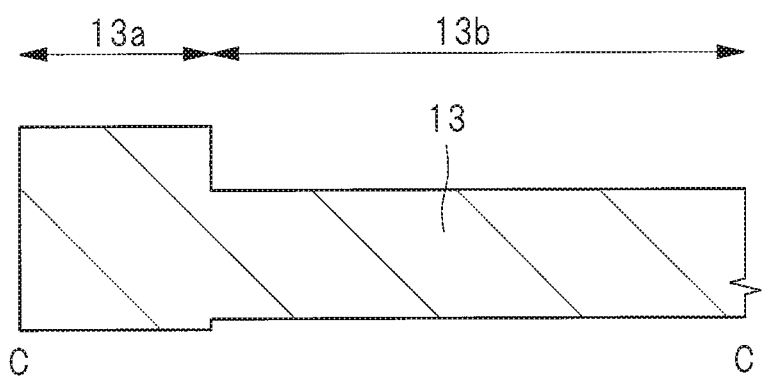
FIG. 14 is a cross-sectional view in a C-C line of FIG. 2.

FIGS. 11 to 14 illustrate the analysis model of a modification example of the analysis model described by using FIGS. 7 to 10. That is, FIGS. 11 to 14 illustrate the analysis model for handling the modification example of the semiconductor device of the present embodiment. FIG. 11 is a cross-sectional view illustrating an end of the analysis model so as to be enlarged. FIG. 12 is a plan view illustrating the analysis model. FIG. 13 is a perspective view illustrating the analysis model. FIG. 14 is a cross-sectional view illustrating an end of a metal plate 13 included in the analysis model. FIG. 14 is a cross-sectional view in a C-C line of FIG. 12.

The structure and dimensions of the analysis model are almost similar to those of the analysis model described by using FIGS. 7 to 10, but are different from the analysis model described by using FIGS. 7 to 10 in that a bottom part of an outer circumferential part 13a of the metal plate 13 protrudes downward as illustrated in FIGS. 11 and 14 in comparison with a bottom part of an inner part 13b of the metal plate 13. That is, the outer circumferential part 13a of the metal plate 13 protrudes upward by 0.5 mm and protrudes downward by 0.05 mm, more than the inner part 13b having a thickness of 1 mm. Thus, the thickness of the outer circumferential part 13a is 1.55 mm.

As analysis conditions, in order to reproduce temperature changes occurring in the semiconductor module, the temperature of the entire module was increased from 25° C. to 175° C. The maximum amount of the strain occurring in the solder 5, 5a, 5b, or 5c due to a difference in mechanical strength such as the linear expansion coefficient of each member at that time was calculated to compare the analysis models of FIGS. 2 to 14. Note that the electrodes 3cb and 3cc which are also wires were set to have a density of 8920 kg/m$^3$, a linear expansion coefficient of $1.7\times10^{-5}$, a Young's modulus of 130 GPa, and a Poisson's ratio of 0.3. The ceramic substrate 3 was set to have a density of 3300 kg/m$^3$, a linear expansion coefficient of $4.5\times10^{-6}$, a Young's modulus of 320 GPa, and a Poisson's ratio of 0.24. The base plate 4 was set to have a density of 2900 kg/m$^3$, a linear expansion coefficient of $7.8\times10^{-6}$, a Young's modulus of 150 GPa, and a Poisson's ratio of 0.3. The solders 5 and 5a to 5c were set to have a density of 7300 kg/m$^3$, a linear expansion coefficient of $2.2\times10^5$, a Young's modulus of 40, and a Poisson's ratio of 0.3.

Also, the metal plates 9, 10, and 13 have a linear expansion coefficient having a value between the linear expansion coefficient of the base plate 4 and the linear expansion coefficients of the ceramic substrate 3 and the electrodes 3cb and 3cc. That is, as the analysis was performed for the metal plates 9, 10, and 13, using a material having a density of 9057 kg/m$^3$, a linear expansion coefficient of $8.5\times10^{-6}$, a Young's modulus of 225 GPa, and a Poisson's ratio of 0.3. Note that the linear expansion coefficients of the ceramic substrate 3 and the electrodes 3cb and 3cc indicate a linear expansion coefficient of an entire structure including the ceramic substrate 3 and the electrodes 3cb and 3cc.

Furthermore, the analysis was performed also for the case in which the metal plates 9, 10, and 13 have a linear expansion coefficient having a value that is not the value between the linear expansion coefficient of the base plate 4 and the linear expansion coefficients of the ceramic substrate 3 and the electrodes 3cb and 3cc. That is, the analysis was performed also for the case in which each of the metal plate 9, 10, and 13 is made of a material having a density of 8920 kg/m$^3$, a linear expansion coefficient of $1.7\times10^{-5}$, a Young's modulus of 130 GPa, and a Poisson's ratio of 0.3. A comparison result will be described later by using FIG. 16, the comparison result being obtained by using the materials of two types in the case in which the values of the linear expansion coefficients of the metal plates 9, 10, and 13 are the value between the linear expansion coefficient of the base plate 4 and the linear expansion coefficients of the ceramic substrate 3 and the electrodes 3cb and 3cc and the case in which the values of the same are not.

FIG. 15 illustrates the analysis results in cases with and without a metal plate for reducing the strain and a case of application of a metal plate with an outer circumferential part thicker than an inner part. FIG. 15 is a bar graph with the vertical axis representing a ratio of the maximum strain amount at the end of the bonding part between the ceramic substrate and the base plate. Sequentially from left, FIG. 15 illustrates a graph X1 indicating an analysis result without a metal plate (refer to FIG. 2), a graph X2 indicating an analysis result with a metal plate having a uniform thickness (refer to FIGS. 3 to 6), a graph Y1 indicating an analysis result with a metal plate whose outer circumferential part protrudes upward (refer to FIGS. 7 to 10), and a graph Y2 indicating an analysis result with a metal plate whose outer circumferential part protrudes upward and downward (refer to FIGS. 11 to 14).

That is, the two graphs X1 and X2 on the left in FIG. 15 indicate a ratio of a strain amount using the analysis model of the comparative example, and the two graphs Y1 and Y2 on the right indicate a ratio of a strain amount using the analysis model for handling the structure of the semiconductor device of the present embodiment. Here, with reference to the strain amount of the leftmost graph X1 in FIG. 15, that is, the strain amount without any metal plate (refer to FIG. 2), a ratio of the strain amount of each of the other analysis results is illustrated. That is, the ratio of the strain amount without any metal plate (refer to FIG. 2) is set at 100% as illustrated in the graph X1.

On the other hand, in the graph X2 indicating the analysis result of another comparative example, the strain amount is hardly decreased in spite of the insertion of the metal plate 10 illustrated in FIG. 5 into the bonding part below the ceramic substrate 3. This is because the metal plate 10 is plastically deformed due to low mechanical strength of the metal plate 10. When the metal plate 10 is deformed as described above, the bonding part is greatly deformed, and therefore, there is a concern that the breakage of the solders 5a and 5b configuring the bonding part is more accelerated.

Also, deformation of the metal plate 10 as described above occurs due to large warpage of the metal plate 10 at the stage of bonding the metal plate 10 to either one member of a ceramic substrate 3 side or a base plate 4 side in a process of manufacturing the semiconductor device. In this case, it becomes difficult to bond the other member (the ceramic substrate 3 or the base plate 4) to the metal plate 10 at a subsequent process, and besides, the strain occurring in the solders 5a and 5b is increased by the warpage of the metal plate 10. Thus, the strain amount can be hardly decreased as illustrated in the graph X2 of FIG. 15 even if the metal plate 10 having the linear expansion coefficient having the value between the linear expansion coefficient of the base plate 4 and the linear expansion coefficients of the ceramic substrate 3 and the electrodes 3cb and 3cc is provided.

On the other hand, the strain amount of the analysis model (refer to FIGS. 7 to 10) for handling the semiconductor device of the present embodiment (refer to FIG. 1) is greatly decreased as illustrated in the graph Y1 more than those in the graphs X1 and X2. This is because, as illustrated in FIGS. 1 and 7 to 10, the structure of the metal plate 9 inserted between the ceramic substrate 3 and the base plate 4 is not a flat structure as the metal plate 10 of the comparative example described by using FIGS. 3 to 6 but a structure in which the outer circumferential part 9a is thicker than the inner part (center part) 9b.

That is, in the present embodiment, by providing a frame-shaped thick portion to the outer circumferential part 9a of the metal plate 9, the mechanical strength of the metal plate 9 is enhanced. Therefore, in the process of manufacturing the semiconductor device, an occurrence of plastic deformation in the thin metal plate 9 can be prevented. Furthermore, by using the power module 20 (refer to FIG. 1), the deformation of the bonding part including the metal plate 9 and the solders 5a and 5b can be prevented even if thermal stress is repeatedly applied between the ceramic substrate 3 and the base plate 4.

Therefore, since the occurrence of the strain in the bonding part below the ceramic substrate 3 can be prevented, the breakage of the power module 20 can be prevented, the breakage being caused by more easiness of heating of the power module 20 because of the breakage of the end of the bonding part by the strain and the decrease in the heat dissipation efficiency. Thus, reliability of the semiconductor device can be improved.

In view of efficient heat dissipation of the semiconductor chip 1 (refer to FIG. 1), note that the thickness of each of the solders 5a and 5b and the metal plate 9 is desirably as small as possible. Also, in order to enhance the bonding strength between the ceramic substrate 3 and the base plate 4, the thickness of each of the solders 5a and 5b is desirably small. Therefore, it is difficult to enhance the strength of the metal plate 10 by simple increase in the thickness of the metal plate 10 (refer to FIG. 5). On the other hand, in the present embodiment, by the increase in the thickness of the metal plate 9 in a region not overlapping the ceramic substrate 3 (outer circumferential part 9a), the strength of the metal plate 9 can be enhanced.

Furthermore, as a structure which enhances the strength of the metal plate 9 while the increase in the thickness of the inner part 9b of the metal plate 9 is suppressed, it can be thought that the outer circumferential part 9a of the metal plate 9 greatly protrudes downward. However, since the thickness of the solder 5b is about 0.1 mm or 0.2 mm, it is difficult to bond the metal plate 9 and the base plate 4 if the outer circumferential part 9a of the metal plate 9 greatly protrudes downward. Therefore, the strength of the metal plate 9 cannot be enhanced by only the downward protrusion of the outer circumferential part 9a of the metal plate 9.

On the other hand, in the present embodiment, since the outer circumferential part 9a is protruded upward so that a part of the thickened metal plate 9 does not make contact with the base plate 4, the difficulty in bonding the metal plate 9 and the base plate 4 can be prevented.

Here, the strain amount of the analysis model (refer to FIGS. 11 to 14) for handling the modification example of the semiconductor device of the present embodiment is greatly decreased as illustrated in the graph Y2 more than the graphs X1 and X2. In the modification example, as illustrated in FIGS. 11 to 14, a part of the metal plate 13 is protruded also to a base plate 4 side, that is, protruded downward. If the downward-protrusion length of the outer circumferential part 13a is smaller in size than the thickness of the solder 5b, the mechanical strength of the metal plate 13 can be enhanced while preventing the difficulty of bonding the metal plate 13 and the base plate 4. In other words, the length of the outer circumferential part 13a which protrudes to the base plate 4 side from the bottom surface of the inner part 13b of the metal plate 13 is smaller than the thickness of the solder 5b.

Even if the value of the linear expansion coefficient of the metal plate 9 illustrated in FIG. 7 is not the value between the linear expansion coefficient of the base plate 4 and the linear expansion coefficients of the ceramic substrate 3 and the electrodes 3cb and 3cc, note that the occurrence of the strain at the end of the bonding part below the ceramic substrate 3 can be prevented as illustrated in the graph Y1 of FIG. 15 by the increase in the thickness of the outer circumferential part 9a of the metal plate 9 to enhance the mechanical strength of the metal plate 9. The same goes for the modification example described by using FIGS. 11 to 14.

That is, when seen in a plan view, the bonding part including the solders 5a and 5b (the solder 5 illustrated in FIG. 1) has an area larger than that of the solder 2 and is a portion where thermal stress tends to increase due to the large area. However, by providing the metal plate 9 as described above, a lead-free semiconductor device having high heat resistance and having a high-reliable bonding part can be achieved.

FIG. 16 illustrates a graph A1 indicating an analysis result in a case of no usage of a metal having a linear expansion coefficient between the linear expansion coefficient of the base plate 4 and the linear expansion coefficients of the ceramic substrate 3 and the electrodes 3cb and 3cc as the material of the metal plate 9 (refer to FIG. 7) and a graph B1 indicating an analysis result in a case of usage of the metal having the linear expansion coefficient between the linear expansion coefficient of the base plate 4 and the linear expansion coefficients of the ceramic substrate 3 and the electrodes 3cb and 3cc as the material of the metal plate 9. FIG. 16 is a bar graph with the vertical axis representing the ratio of the maximum strain amount at the end of the bonding part between the ceramic substrate and the base plate.

As illustrated in the graph B1 of FIG. 16, By using the metal having the linear expansion coefficient between the linear expansion coefficient of the base plate 4 and the linear expansion coefficients of the ceramic substrate 3 and the electrodes 3cb and 3cc as the member of the metal plate 9 (refer to FIG. 7), the strain can be greatly decreased more than that in the case of the graph A1. This is because the metal plate 9 illustrated in FIG. 7 is functioned as a buffer layer for the stress caused by the difference in the linear expansion coefficient between the ceramic substrate 3 and the base plate 4 by using the metal having the linear expansion coefficient between the linear expansion coefficient of the base plate 4 and the linear expansion coefficients of the ceramic substrate 3 and the electrodes 3cb and 3cc as the metal plate 9.

Also, FIG. 17 illustrates the analysis results obtained when the thicknesses of the solders 5a and 5b as the bonding part illustrated in FIG. 7 are the same as each other and when they are different from each other. FIG. 17 is a bar graph with the vertical axis representing the ratio of the maximum strain amount at the end of the bonding part between the ceramic substrate and the base plate. Sequentially from left, FIG. 17 illustrates a graph C1 obtained when the thicknesses of the solders 5a and 5b are the same as each other, a graph D1 obtained when the thickness of the solder 5a is larger than the thickness of the solder 5b, and a graph E1 obtained when the thickness of the solder 5a is smaller than the thickness of the solder 5b.

As illustrated in FIG. 17, from the analyses, it has been confirmed by the present inventors, that the strain amount is not increased even when the thicknesses of the solders 5a and 5b are different from each other (refer to the graph D1) in comparison with the case in which the thicknesses of the solders 5a and 5b are the same as each other (refer to the graph C1), and that the strain amount is decreased when the thickness of the solder 5a is smaller than the thickness of the solder 5b. Therefore, by making the thickness of the solder 5b to be larger than the thickness of the solder 5a, the occurrence of the strain is prevented, so that the reliability of the semiconductor device can be improved.

(Second Embodiment)

Figure 18:
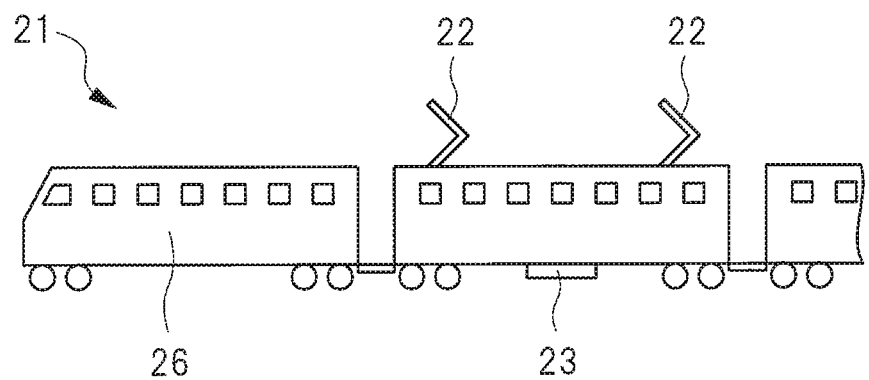
FIG. 18 is a side view illustrating a railway vehicle according to a second embodiment of the present invention.
Figure 19:
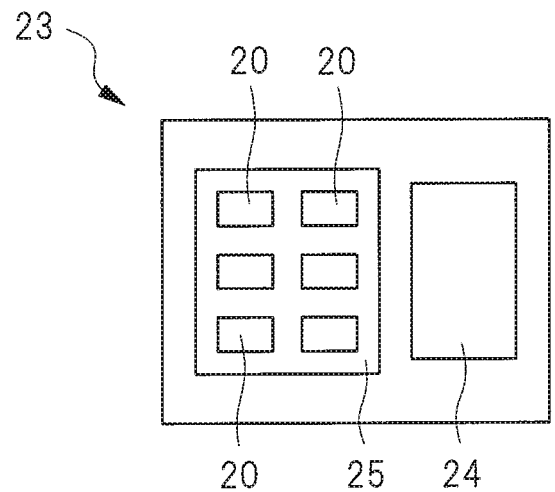
FIG. 19 is a plan view illustrating an inner structure of an inverter installed in the railway vehicle according to the second embodiment of the present invention.

FIG. 18 is a side view partially illustrating a railway vehicle on which the semiconductor device (refer to FIG. 1) illustrated in FIG. 1 is mounted, and FIG. 19 is a plan view illustrating an inner structure of an inverter installed in the railway vehicle illustrated in FIG. 18.

In the present embodiment, the railway vehicle on which the power module 20 (refer to FIG. 1) of the above-described embodiment is mounted is described. A railway vehicle 21 illustrated in FIG. 18 on which, for example, the power module 20 illustrated in FIG. 1 is mounted, includes a vehicle main body 26, a pantograph 22 which is a power collection device, and an inverter 23. The power module 20 is mounted on the inverter 23 installed below the vehicle main body 26 (refer to FIGS. 18 and 19).

Inside the inverter 23 as illustrated in FIG. 19, a plurality of power modules 20 are mounted on a printed board (mounting member) 25, and a cooling device 24 which cools these power modules 20 is further mounted thereon. In the power module 20 of the present embodiment illustrated in FIG. 1, the amount of the heat generated from the semiconductor chip 1 is large. Therefore, the cooling device 24 is attached so as to be able to cool the plurality of power modules 20 to cool the inside of the inverter 23. That is, the power module 20 is mounted on the inverter 23 so that the bottom surface of the base plate 4 of FIG. 1 makes contact with the cooling device 24 illustrated in FIG. 19.

In this manner, in the railway vehicle 21 illustrated in FIG. 18, since the inverter 23 on which the plurality of power modules 20 using the module bonding structure illustrated in FIG. 1 are provided, even if the inside of the inverter 23 becomes a high-temperature environment, reliability of the inverter 23 and the railway vehicle 21 provided with the inverter can be enhanced. That is, it is possible to achieve the power module 20 which has operation stability under a high-temperature environment and which can resist against high current load and achieve an inverter system using the power module.

The plurality of power modules 20 are not necessary, and a single use thereof is possible in accordance with a scale of a device to be controlled.

(Third Embodiment)

Figure 20:
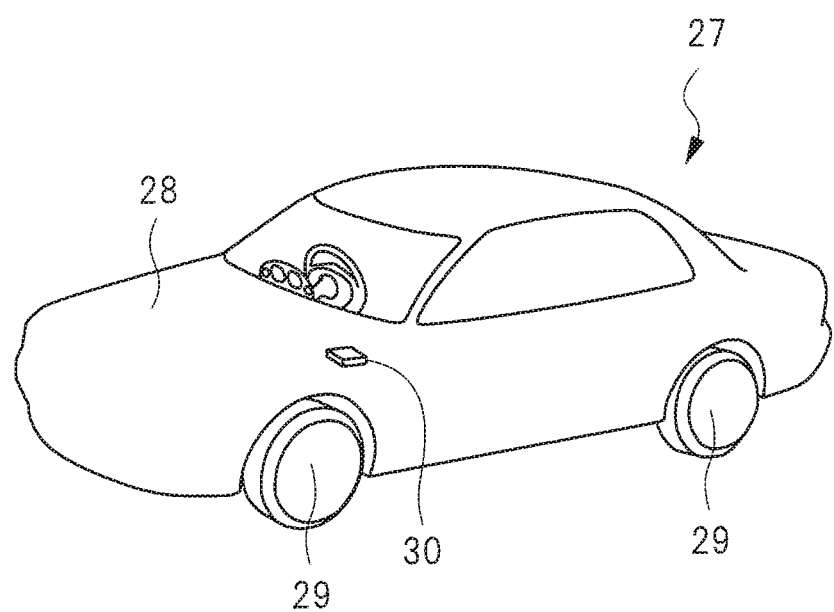
FIG. 20 is a perspective view illustrating an automobile according to a third embodiment of the present invention.

Next, an automobile on which the power module 20 of the above-described first embodiment is mounted is described. FIG. 20 is a perspective view illustrating an example of the automobile on which the semiconductor device illustrated in FIG. 1 is mounted.

An automobile 27 illustrated in FIG. 20 on which, for example, the power module 20 illustrated in FIG. 1 is mounted, includes a vehicle body 28, tires 29, and a mounting unit 30 which is a mounting member for supporting the power module 20 (refer to FIG. 1).

In the automobile 27, the power module 20 is mounted on an inverter included in the mounting unit 30, and the mounting unit 30 is, for example, an engine control unit or others. In this case, the mounting unit 30 is arranged in vicinity of an engine. In this case, the mounting unit 30 is used under a high-temperature environment, and therefore, the power module 20 also becomes in a high-temperature state.

In the automobile 27, since the inverter on which a plurality of power modules 20 using the bonding structure illustrated in FIG. 1 are mounted is provided, reliability of the automobile 27 can be enhanced even if the mounting unit 30 becomes in a high-temperature environment. That is, in the automobile 27, it is possible to achieve the power module 20 which has operation stability under a high-temperature environment and which can resist against high current load and achieve an inverter system using the power module. Also, the invention is also applicable to an alternatng current generator, an alternator, and others.

In the foregoing, the invention made by the present inventors has been concretely described based on the embodiments. However, it is needless to say that the present invention is not limited to the foregoing embodiments and various modifications and alterations can be made within the scope of the present invention.

Note that the present invention is not limited to the embodiments described above and includes various modification examples. For example, the embodiments described above are explained in detail for easily understanding the present invention, and are not necessarily limited to those including all the explained structures.

Also, a part of the structure of an embodiment can be replaced by the structure of another embodiment. For example, the power module of the modification example of the first embodiment described by using FIGS. 11 to 14 may be used for the inverter of the second or third embodiment.

The inverter explained in each of the embodiments described above is applicable to not only a movable body represented by the railway vehicle of the second embodiment and the automobile of the third embodiment but also a construction machine and an elevator as various types of the movable body.

Furthermore, the semiconductor device of the invention of the present application is applicable also to fields of power generation apparatuses such as a photovoltaic power generation apparatus, a photovoltaic power generation module, a wind power generator, and a wind power generation module. Still further, the semiconductor device is applicable also to a field of industrial machines represented by a hoist, an actuator, and a compressor. Still further, the semiconductor device is applicable also to a field of calculators such as an uninterruptible power supply apparatus, a main frame, and a general-purpose calculator.

These examples can also have operation stability under a high-temperature environment and can resist against a high current load. The above-described apparatuses in the fields using the semiconductor device are collectively referred to power electronics apparatuses.

The invention of the present application is applicable to any apparatus as long as the apparatus is in the above-described power electronics field, and is useful for improving the reliability of the apparatus.

INDUSTRIAL APPLICABILITY

The present invention is effectively applied to a semiconductor device which dissipates heat via a bonding part and a power electronics apparatus using the semiconductor device.

DESCRIPTION OF REFERENCE CHARACTERS 1 semiconductor chip
1c electrode
2 solder
3 ceramic substrate (wiring substrate)
3ca, 3cb, 3cc electrode
4 base plate (metal plate)
5 solder (bonding member)
5a solder (bonding member)

5b solder (bonding member)
6 wire
7 terminal
8 case
9 metal plate
20 power module

The invention claimed is:
1. A semiconductor device comprising:
a semiconductor chip;
a wiring substrate which supports the semiconductor chip and is electrically connected to the semiconductor chip;
a first metal plate which supports the wiring substrate;
a second metal plate which is arranged between the wiring substrate and the first metal plate;
a first bonding part which bonds the wiring substrate and the second metal plate; and
a second bonding part which bonds the first metal plate and the second metal plate,
wherein a thickness of an outer circumferential part of the second metal plate is larger than a thickness of a center part of the second metal plate, and
wherein a linear expansion coefficient of the second metal plate has a value between a linear expansion coefficient of the wiring substrate and a linear expansion coefficient of the first metal plate.
2. The semiconductor device according to claim 1,
wherein, in a direction perpendicular to an upper surface of the first metal plate, the outer circumferential part of the second metal plate protrudes toward the wiring substrate side more than an upper surface of the center part.
3. The semiconductor device according to claim 1,
wherein the second bonding part, the second metal plate, the first bonding part, the wiring substrate, and the semiconductor chip are sequentially arranged on the first metal plate,
the semiconductor chip and the wiring substrate are bonded to each other by a third bonding part which is inserted therebetween, and,
when seen in a plan view, an area of each of the first bonding part and the second bonding part is larger than an area of the third bonding part.
4. The semiconductor device according to claim 1,
wherein a thickness of the second bonding part is larger than a thickness of the first bonding part.
5. The semiconductor device according to claim 1,
wherein the first bonding part and the second bonding part contain a Sn-based solder alloy.
6. A semiconductor device comprising:
a semiconductor chip;
a wiring substrate which supports the semiconductor chip and is electrically connected to the semiconductor chip;
a first metal plate which supports the wiring substrate;
a second metal plate which is arranged between the wiring substrate and the first metal plate;
a first bonding part which bonds the wiring substrate and the second metal plate; and
a second bonding part which bonds the first metal plate and the second metal plate,
wherein a thickness of an outer circumferential part of the second metal plate is larger than a thickness of a center part of the second metal plate,
wherein the second bonding part, the second metal plate, the first bonding part, the wiring substrate, and the semiconductor chip are sequentially arranged on the first metal plate, and
the outer circumferential part of the second metal plate is positioned outside the wiring substrate when seen in a plan view.
7. The semiconductor device according to claim 6,
wherein, in a direction perpendicular to an upper surface of the first metal plate, the outer circumferential part of the second metal plate protrudes toward the wiring substrate side more than an upper surface of the center part, and
a distance in the direction between the upper surface of the center part of the second metal plate and an upper surface of the outer circumferential part is larger than a distance in the direction between the upper surface of the center part of the second metal plate and the wiring substrate.
8. The semiconductor device according to claim 6,
wherein, in a direction perpendicular to an upper surface of the first metal plate, the outer circumferential part of the second metal plate protrudes toward the wiring substrate side more than an upper surface of the center part.
9. The semiconductor device according to claim 6,
wherein the second bonding part, the second metal plate, the first bonding part, the wiring substrate, and the semiconductor chip are sequentially arranged on the first metal plate,
the semiconductor chip and the wiring substrate are bonded to each other by a third bonding part which is inserted therebetween, and,
when seen in a plan view, an area of each of the first bonding part and the second bonding part is larger than an area of the third bonding part.
10. The semiconductor device according to claim 6,
wherein a thickness of the second bonding part is larger than a thickness of the first bonding part.
11. The semiconductor device according to claim 6,
wherein the first bonding part and the second bonding part contain a Sn-based solder alloy.
12. A semiconductor device comprising:
a semiconductor chip;
a wiring substrate which supports the semiconductor chip and is electrically connected to the semiconductor chip;
a first metal plate which supports the wiring substrate;
a second metal plate which is arranged between the wiring substrate and the first metal plate;
a first bonding part which bonds the wiring substrate and the second metal plate; and
a second bonding part which bonds the first metal plate and the second metal plate,
wherein a thickness of an outer circumferential part of the second metal plate is larger than a thickness of a center part of the second metal plate,
wherein, in a direction perpendicular to an upper surface of the first metal plate, the outer circumferential part of the second metal plate protrudes toward the wiring substrate side more than an upper surface of the center part,
wherein, in the direction, the outer circumferential part of the second metal plate protrudes toward the first metal plate side more than a lower surface of the center part, and,
in the direction, a protrusion length of the outer circumferential part toward the first metal plate side from the lower surface of the center part of the second metal plate is smaller than a thickness of the second bonding part.

13. The semiconductor device according to claim 12,
wherein the second bonding part, the second metal plate, the first bonding part, the wiring substrate, and the semiconductor chip are sequentially arranged on the first metal plate,
the semiconductor chip and the wiring substrate are bonded to each other by a third bonding part which is inserted therebetween, and,
when seen in a plan view, an area of each of the first bonding part and the second bonding part is larger than an area of the third bonding part.

14. The semiconductor device according to claim 12,
wherein a thickness of the second bonding part is larger than a thickness of the first bonding part.

15. The semiconductor device according to claim 12,
wherein the first bonding part and the second bonding part contain a Sn-based solder alloy.

\* \* \* \* \*